United States Patent
West et al.

(10) Patent No.: US 8,803,180 B2
(45) Date of Patent: *Aug. 12, 2014

(54) MICRO-BEAD BLASTING PROCESS FOR REMOVING A SILICONE FLASH LAYER

(71) Applicant: Bridgelux, Inc., Livermore, CA (US)

(72) Inventors: R. Scott West, Pleasanton, CA (US);
Tao Tong, Fremont, CA (US); Mike Kwon, Pleasanton, CA (US)

(73) Assignee: Bridgelux, Inc., Livermore, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/060,860

(22) Filed: Oct. 23, 2013

(65) Prior Publication Data

US 2014/0048832 A1 Feb. 20, 2014

Related U.S. Application Data

(63) Continuation of application No. 13/972,887, filed on Aug. 21, 2013, now Pat. No. 8,610,153, which is a continuation of application No. 13/304,769, filed on Nov. 28, 2011, now Pat. No. 8,536,605.

(51) Int. Cl.
| | |
|---|---|
| *H01L 33/56* | (2010.01) |
| *H01L 33/58* | (2010.01) |
| *B24C 1/04* | (2006.01) |
| *B24C 3/32* | (2006.01) |
| *B24C 1/00* | (2006.01) |
| *H01L 25/075* | (2006.01) |
| *H01L 33/54* | (2010.01) |

(52) U.S. Cl.
CPC ....... *H01L 33/56* (2013.01); *H01L 2224/48091* (2013.01); *H01L 25/0753* (2013.01); *H01L 33/58* (2013.01); *B24C 1/04* (2013.01); *H01L 33/54* (2013.01); *H01L 2933/005* (2013.01); *B24C 3/322* (2013.01); *B24C 1/003* (2013.01); *H01L 2224/48137* (2013.01); *H01L 2933/0033* (2013.01)
USPC .......................................................... 257/98

(58) Field of Classification Search
CPC .............................. H01L 33/56; H01L 33/58
See application file for complete search history.

(56) References Cited

U.S. PATENT DOCUMENTS

| 7,511,298 B2 | 3/2009 | Kawaraya et al. ............... 257/43 |
| 2008/0157114 A1* | 7/2008 | Basin et al. ..................... 257/98 |

(Continued)

FOREIGN PATENT DOCUMENTS

| JP | 2006-190764 | 7/2006 |
| JP | 2011-108748 | 6/2011 |

(Continued)

OTHER PUBLICATIONS

International Search Report and Written Opinion by the Korean Intellectual Property Office (KIPO) as international searching authority (ISA) in the related international application PCT/US13/023261 dated Mar. 28, 2013 (25 pages).

*Primary Examiner* — Whitney T Moore
(74) *Attorney, Agent, or Firm* — Imperium Patent Works; Darien K. Wallace

(57) ABSTRACT

Using compression molding to form lenses over LED arrays on a metal core printed circuit board leaves a flash layer of silicone covering the contact pads that are later required to connect the arrays to power. A method for removing the flash layer involves blasting particles of sodium bicarbonate at the flash layer. A nozzle is positioned within thirty millimeters of the top surface of the flash layer. The stream of air that exits from the nozzle is directed towards the top surface at an angle between five and thirty degrees away from normal to the top surface. The particles of sodium bicarbonate are added to the stream of air and then collide into the top surface of the silicone flash layer until the flash layer laterally above the contact pads is removed. The edge of silicone around the cleaned contact pad thereafter contains a trace amount of sodium bicarbonate.

19 Claims, 6 Drawing Sheets

(56) References Cited

U.S. PATENT DOCUMENTS

| | | | |
|---|---|---|---|
| 2009/0170225 A1 | 7/2009 | Oka et al. | 438/22 |
| 2010/0078661 A1 | 4/2010 | Shi et al. | 257/98 |
| 2010/0171142 A1* | 7/2010 | Chen | 257/99 |
| 2011/0012143 A1 | 1/2011 | Yuan et al. | 257/91 |
| 2011/0027458 A1 | 2/2011 | Boock et al. | 427/9 |

FOREIGN PATENT DOCUMENTS

| | | |
|---|---|---|
| JP | 2011-187451 | 9/2011 |
| WO | WO2004/033756 | 4/2004 |

\* cited by examiner

MICRO-BEAD BLASTING PROCESS FOR REMOVING A SILICONE FLASH LAYER

CROSS REFERENCE TO RELATED APPLICATIONS

This application is a continuation of, and claims priority under 35 U.S.C. §120 from, nonprovisional U.S. patent application Ser. No. 13/972,887 entitled "Micro-Bead Blasting Process for Removing a Silicone Flash Layer," filed on Aug. 21, 2013, now U.S. Pat. No. 8,610,153, the subject matter of which is incorporated herein by reference. Application Ser. No. 13/972,887, in turn, is a continuation of, and claims priority under 35 U.S.C. §120 from, nonprovisional U.S. patent application Ser. No. 13/304,769 entitled "Micro-Bead Blasting Process for Removing a Silicone Flash Layer," filed on Nov. 28, 2011, now U.S. Pat. No. 8,536,605, the subject matter of which is also incorporated herein by reference.

TECHNICAL FIELD

The present invention relates generally to packaging light-emitting diodes and, more specifically, to a method for removing a silicone flash layer following compression molding.

BACKGROUND INFORMATION

A light emitting diode (LED) is a solid state device that converts electrical energy to light. Light is emitted from active layers of semiconductor material sandwiched between oppositely doped layers when a voltage is applied across the doped layers. In order to use an LED chip, the chip is typically enclosed in a package that focuses the light and that protects the chip from being damaged. When LEDs are packages in arrays as opposed to as discrete light emitters, the LED chips of the arrays are mounted directed on a printed circuit board without the carrier substrate conventionally used with discrete light emitters. The LED chips packaged as arrays are electrically connected to contact pads and to traces in a top trace layer of the printed circuit board. The LED chips are wire bonded to the traces on the top side of the printed circuit board. The printed circuit board is then segmented to form discrete array light sources. Larger exposed areas of the traces on the top side form contact pads to which supply power is connected to each discrete array light source.

The LEDs are typically covered with a layer of phosphor before the array light sources on the printed circuit board are segmented. The phosphor converts a portion of the blue light generated by the LEDs to light in the yellow region of the optical spectrum. The combination of the blue and yellow light is perceived as "white" light by a human observer. Before the array light sources are segmented, the LEDs are typically covered by a layer of silicone that is formed into a lens above each light source. The layer of silicone also protects the LED chips and top-side wire bonds.

A slurry containing the phosphor has been conventionally dispensed manually into a ring or dam around the LED chips of each array light source. Then injection molding or casting molding has been used to form a lens above each array light source. The manufacturing process for LED light sources has been improved by combining the steps of dispensing the phosphor and forming the lens. By adding the phosphor to the silicone, the separate step of dispensing phosphor can be eliminated, and lenses are formed with phosphor dispersed throughout each lens. The lenses are formed using injection molding in which lens cavities that contain the LED dies are filled with the lens material, and the excess lens material is squeezed out of a leakage path.

When casting molding is used, a phosphor silicone slurry is first dispensed into the bottom half of each cavity, and then the top half of the cavity closes to define the lens structure and squeezes out the excessive lens material. The injection molding and casting molding processes have multiple disadvantages. First, the phosphor and the silicone are expensive, and the lens material that is squeezed out of the cavities is wasted. Second, the quality of the lenses formed with injection molding and casting molding is low because bubbles and nonuniformities remain in the finished product.

These disadvantages can be overcome by using compression molding in which the lens material is contained in a single sealed cavity under compression. Placing the lens material initially under a vacuum and then under high pressure between the two parts of the compression mold ensures a uniform consistency of the lens material throughout the cavity and prevents bubbles from forming. Moreover, only the amount of lens material that is actually used is pumped into the sealed cavity, so no lens material is wasted.

Unfortunately, at least one complication must be overcome before compression molding can be used to form lenses over LED array light sources on printed circuit boards. The compression molding process relies on the lens material being able to flow freely through a flash layer between the individual lens cavities so that the lens material is uniformly distributed. Consequently, the entire surface of the printed circuit board between the lenses is covered by the flash layer. So the contact pads for each LED array on the top side of the printed circuit board are covered by the flash layer of silicone, which inhibits an electrical contact being made with the contact pads. Existing compression molding techniques require the flash layer to be at least fifty microns thick, whereas the trace layer that forms the contact pads can be as thin as a couple of microns. Manually scraping off the flash layer would either damage the contact pads or not remove the silicone from the entire surface of the contact pads. Taping over the contact pads before the compression molding step and then later removing the tape would increase the cost by adding two additional steps. In addition, the silicone at the edges of the lenses could tear when the tape is lifted.

An efficient method is sought for removing the flash layer of silicone that results from compression molding without damaging either the lenses or the trace metal layer that forms the contact pads on the top side of the printed circuit board.

SUMMARY

Using compression molding to form lenses of silicone over LED arrays on a metal core printed circuit board (MCPCB) leaves a flash layer of silicone covering the contact pads that are later required to connect the arrays to power. A method for removing the silicone flash layer involves blasting abrasive particles in a stream of air at the silicone flash layer. The particles can be made of sodium bicarbonate, sodium sulfate, ammonium bicarbonate, silicon dioxide, aluminum oxide, a plastic or glass beads. The abrasive particles have a median diameter that is between forty and sixty microns. A nozzle is positioned within thirty millimeters of the top surface of the flash layer. The flow of air is generated by compressing the air to a pressure of more than one hundred pounds per square inch and allowing the compressed air to escape from a nozzle that has a diameter of less than two millimeters. The stream of air that exits from the nozzle is directed towards the top surface at an angle between five and thirty degrees away from normal to the top surface. The abrasive particles are added to the stream of air such that the particles are carried by the stream of air. The particles then collide into the top surface of the flash layer of silicone until the flash layer laterally above the contact pads is removed.

An LED array light source includes LED dies mounted on a MCPCB. A layer of silicone forms a lens above the LED dies. The MCPCB has a trace layer and a solder mask layer. The LED dies are electrically coupled to the trace layer. The solder mask layer is disposed over the trace layer. A contact pad is formed on the trace layer by an opening in the solder mask. The layer of silicone that is disposed over the LED dies forms an edge around the contact pad. The layer of silicone is not present laterally above the contact pad. The layer of silicone contains a trace amount of a blasting medium at the edge of the layer of silicone. The blasting medium is sodium bicarbonate, sodium sulfate or ammonium bicarbonate. The layer of silicone can also contain phosphor. The trace amount of the blasting medium was embedded into the edge of the silicone around the contact pad when a flash layer of silicone was removed from above the contact pad by blasting abrasive particles of the blasting medium in a stream of air at the silicone flash layer.

In another embodiment, an LED array light source includes a printed circuit board (PCB), an LED die, a contact pad and a layer of silicone. The PCB has a top side, a bottom side, and four top edges. The LED die and the contact pad are disposed on the top side of the PCB. The layer of silicone is disposed over the LED die and extends to each top edge of the PCB. However, the layer of silicone is not disposed laterally above a portion of the contact pad because the silicone has been removed by blasting abrasive particles in a stream of air at the layer of silicone.

In yet another embodiment, a high-pressure stream of water is used to remove the flash layer of silicone over the contact pads. The water is pressurized to a pressure of over fifty pounds per square inch and then forced through a nozzle with a diameter of less than one millimeter. The pressurized stream of water is aimed directly at the silicone flash layer over the contact pads until the flash layer is removed. Alternatively to using pure water, abrasive particles made of silica, aluminum oxide or garnet can be added to the stream of water to allow the deflashing process to be performed at a lower water pressure compared to using pure water.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
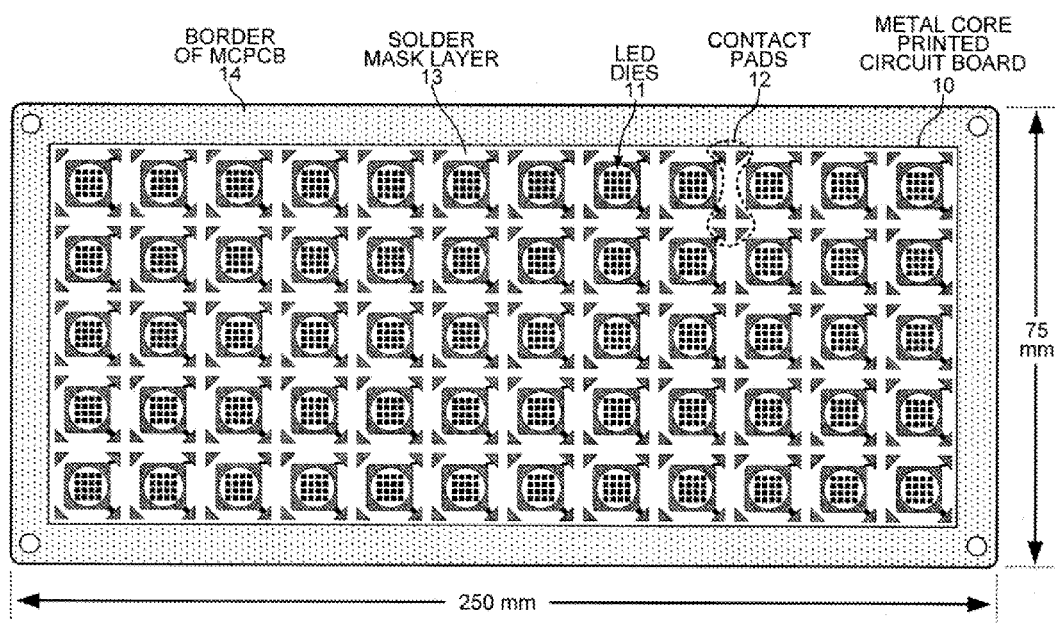
FIG. 1 is a top view of a metal core printed circuit board (MCPCB) on which multiple arrays of LED dies are mounted.

FIG. 1 is a top view of a metal-core printed circuit board (MCPCB) 10 on which multiple arrays of LED dies 11 are mounted. Because MCPCB 10 has a metal core, it would be difficult to supply power to the LED dies 11 through throughhole vias that pass from the LEDs through the printed circuit board to the bottom surface of the board. Consequently, the LED dies 11 are electrically connected to contact pads on the top side of MCPCB 10. The MCPCB 10 is then segmented to form discrete array light sources. The discrete light sources can be used as standardized photon building blocks by packaging them in a multitude of ways using a molded interconnect structure that electrically contacts the photon building blocks from the top side. For a more detailed description of discrete light sources packaged in an interconnect structure that electrically connects to the discrete light sources only from the top side, see U.S. patent application Ser. No. 12/987, 148 filed on Jan. 9, 2011, entitled "Packaging Photon Building Blocks Having Only Top Side Connections in an Interconnect Structure," published as U.S. Pat. App. Pub. 2012/0175643, which is incorporated herein by reference.

In the embodiment of FIG. 1, MCPCB 10 includes a 5×12 matrix of 4×4 LED arrays. MCPCB 10 has a length of about 250 mm and a width of about 75 mm. Each LED array is later segmented into a square of the MCPCB that is 11.5 mm on a side. Thus, MCPCB 10 has a very high density of light sources per area of the printed circuit board. There are less than three millimeters of space on the board between the edge of the lens that covers the LED dies 11 and the edge of each of the segmented square light source. At each corner of the square is a contact pad 12 that is used to supply power to the array light source. The contact pads 12 are formed by exposing large triangular areas of a trace layer. The trace layer is covered by a solder mask layer 13 of hardened epoxy. Holes in solder mask layer 13 form the contact pads 12 and the locations on the trace layer below to which the LED dies 11 are wire bonded.

A lens is formed over each LED array using compression molding. Compression molding can be used because there are no holes or opening from the top side to the bottom side of MCPCB 10 through which high pressure molding material could escape. Conventional printed circuit boards used to mount LED arrays have punch-outs or etchings cuts to isolate the electrical leads of each LED array. MCPCB 10, on the other hand, is a closed board with no punch outs, holes or etching cuts through the board. The very high density of components and the closed board of MCPCB 10 are conducive to compression molding. A single molding chamber is formed over the top of MCPCB 10 by sealing the chamber around the border 14 of MCPCB 10. A small space is maintained between solder mask layer 13 and the mold cover to allow the molding material to flow freely between the individual cavities above the LED arrays. In the actual molding process, MCPCB 10 is inverted and lowered into the mold cover, which contains the lens cavities. The molding material is pumped into the single molding chamber under pressure and fills all of the crevices of the cavities without leaving bubbles or nonuniformities in the hardened molding material. The molding material that fills the small space between the mold cover and solder mask layer 13 forms a thin flash layer that covers the contact pads 12 that must later be electrically coupled to the interconnect packaging structure.

In one embodiment, the molding material is a slurry of phosphor particles in silicone. The phosphor is evenly dispersed throughout the silicone and converts a portion of the blue light generated by the LEDs into light in the yellow and red regions of the optical spectrum. The blue light from the LEDs and the yellow and red light from the phosphor combine to yield white light, which is optically spread out by the surface of the lens. After the lenses are formed using compression molding, the individual LED array light sources are segmented by cutting MCPCB 10 into squares. It is more efficient, however, first to remove the flash layer that covers the contact pads 12 before segmenting MCPCB 10 into individual LED array light sources.

Figure 2:
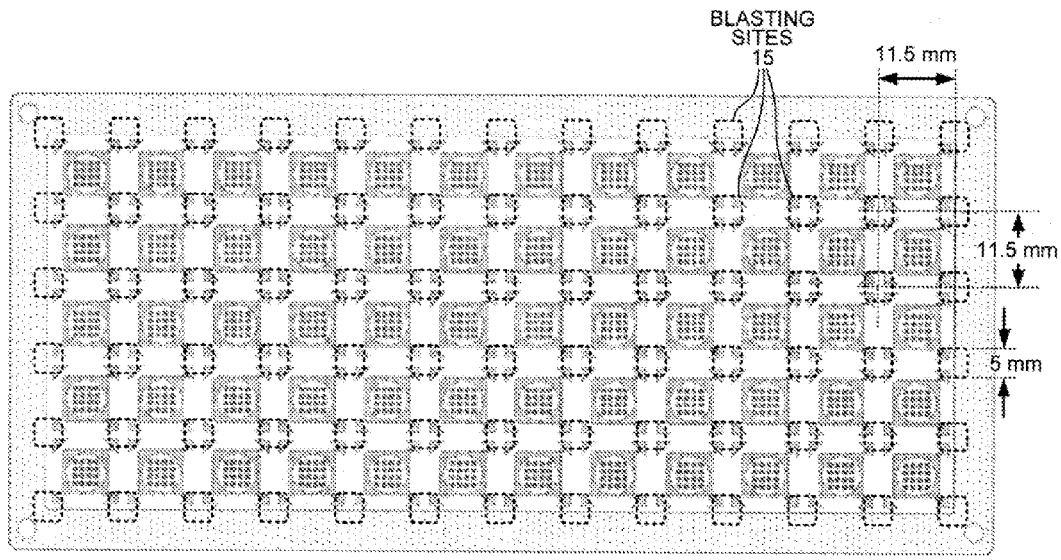
FIG. 2 is a top view of the MCPCB of FIG. 1 on which areas have been marked to show where a flash layer should be removed to expose contact pads.

FIG. 2 is a top view of MCPCB 10 of FIG. 1 on which areas have been marked to show where the flash layer should be removed to expose the contact pads 12. For a unit size of 11.5 mm by 11.5 mm for the LED array light sources of FIG. 1, the contact pads 12 can be cleaned of the silicone flash layer by removing silicone from 5 mm by 5 mm squares. A novel micro-bead blasting process is used to remove the silicone flash layer from the square blasting sites 15.

Figure 3:
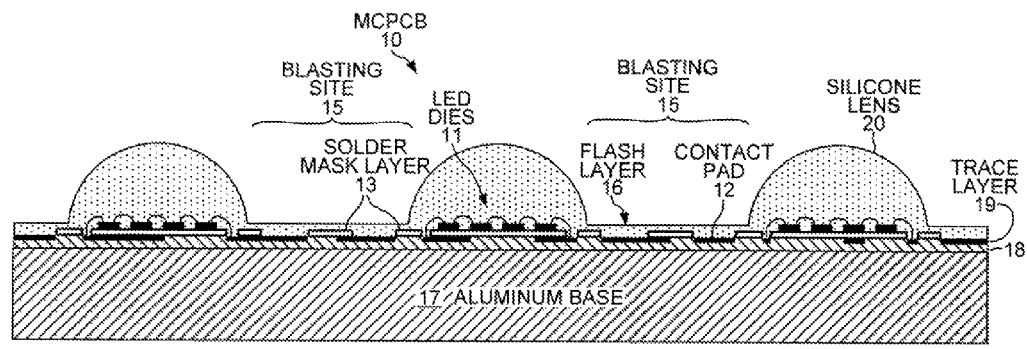
FIG. 3 is a cross sectional view of the MCPCB of FIG. 1 showing the flash layer that is to be removed using the novel blasting process.

FIG. 3 is a cross sectional view of MCPCB 10 of FIG. 1 showing the flash layer 16 that is to be removed using the novel blasting process. MCPCB 10 has a thick solid aluminum base 17. For example, aluminum base 17 is 1.6 mm thick. A dielectric layer 18 separates aluminum base 17 from the trace layer 19 that forms the contact pads 12. Dielectric layer 18 has a thickness of about twenty microns (micrometers or μm). Trace layer 19 does not entirely cover dielectric layer 18, but rather is formed by patterned traces separated by dielectric material. Solder mask layer 13 covers trace layer 19 and has openings only over the contact pads 12 and the locations at which the LED dies 11 are wire bonded to traces.

The molded silicone forms lenses 20 over the arrays of LED dies 11. In the embodiment of FIG. 3, the diameter of lens 20 is about twice as long as each side of the 4×4 array of LED dies so as to allow most of the emitted light to reach the surface of lens 20 within the critical angle required for the light to escape from the lens. The height of the lens 20 is about 1.5 mm from solder mask layer 13. Other embodiments have lenses of different sizes and shapes over the LED dies 11. For example, the silicone above each LED array can have a small overall curvature that is covered by many smaller microstructures, such as hemispheres or pyramids. Alternatively, the lens shape can have a dimple above the middle of each LED array.

Figure 4:
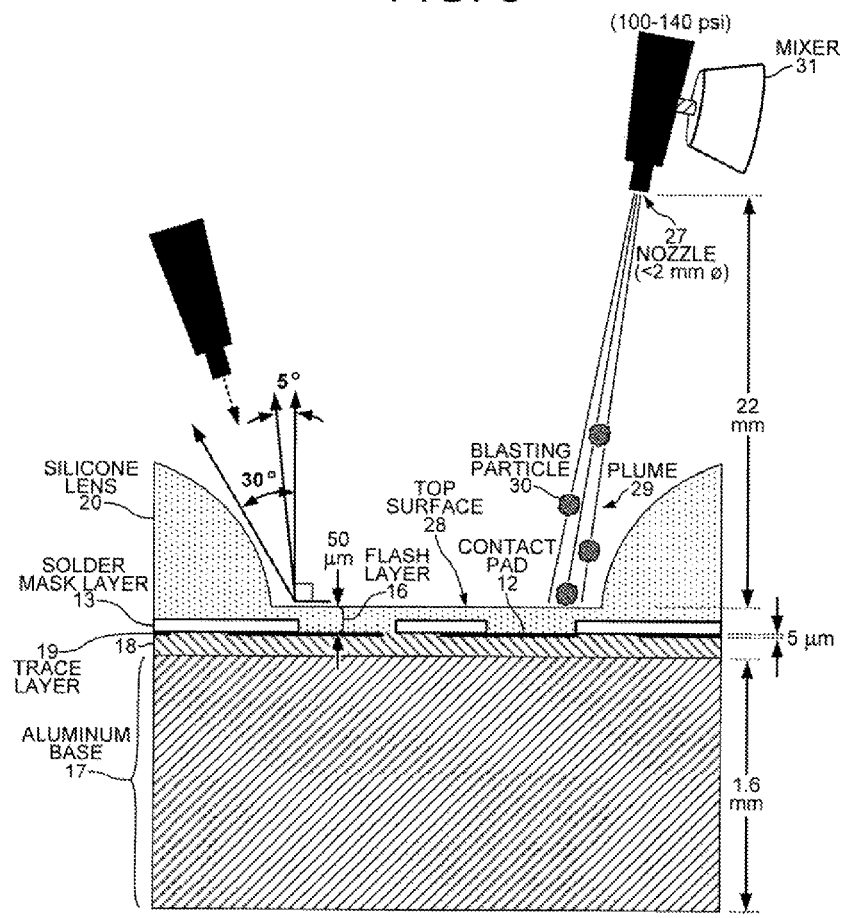
FIG. 4 is a more detailed view of the flash layer of FIG. 3.

FIG. 4 is a more detailed view of flash layer 16 of FIG. 3. FIG. 4 shows that flash layer 16 is relatively thick compared to trace layer 19. Whereas in some compression molding processes flash layer 16 has a thickness between fifty to one hundred microns, trace layer 19 can have a thickness of less than five microns. Trace layer 19 typically has three sublayers: a thicker lower layer of copper, a thinner middle layer of nickel, and a thinner upper layer of either gold or silver. Copper is less expensive than nickel, gold or silver, so the traces are comprised mostly of copper. The upper layer of gold or silver are required because it is difficult to solder the wire bonds directly to copper. The middle layer of nickel is used to attach the gold or silver to the thicker copper layer because gold and silver do not readily adhere directly to copper. The copper is typically 2-80 microns thick, the nickel is typically 1-3 microns thick, and the gold or silver is typically 1-5 microns thick. Thus, the contact pads 12 will be damaged if the gold or silver that is no thicker than five microns is removed from the upper surface of the trace layer 19. The novel micro-bead blasting process provides a way of removing silicone flash layer that is about fifty microns thick without removing the upper layer of trace layer 19, which is only about one tenth as thick.

Figure 5:
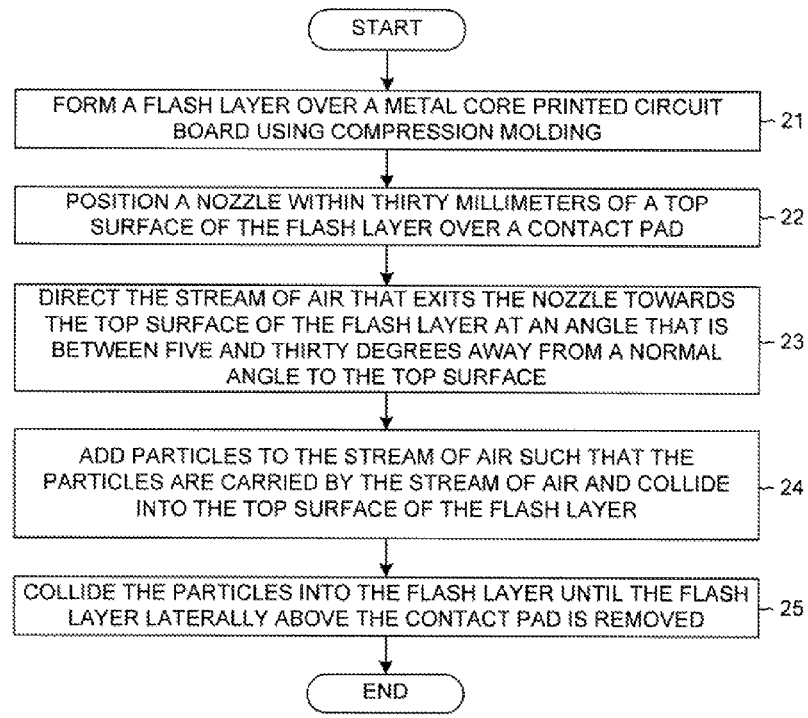
FIG. 5 is a flowchart of steps of a method for removing a flash layer of silicone that covers contact pads without damaging the contact pads.

FIG. 5 is a flowchart illustrating steps 21-26 of a microbead blasting process that removes a flash layer of silicone that covers contact pads without damaging the contact pads. The steps of the method of FIG. 5 are described in relation to FIG. 4.

In a first step 21, the flash layer 16 is formed over the printed circuit board 10 using compression molding. Although the flash layer 16 of FIG. 4 results from compression molding silicone, other transparent molding materials may also be used, such as epoxy. The flash layer of silicone 16 in FIG. 4 is disposed above two contact pads 12.

In step 22, a nozzle 27 is positioned within thirty millimeters of a top surface 28 of flash layer 16. In order to clean a blasting site 15 that is 5 mm by 5 mm square, the method of FIG. 5 uses a nozzle 27 that has a diameter of about two millimeters and that is placed about twenty-two millimeters above top surface 28. A smaller nozzle diameter would be used to remove a flash layer from a smaller blasting site, in which case the nozzle would be positioned closer to the top surface of the flash layer. For example, in order to clean the flash layer from a blasting site 15 having a diameter of two millimeters located between LED arrays having unit sizes of five millimeters on a side, nozzle 27 would have a diameter of about 0.5 millimeters and would be positioned about two millimeters above the top surface 28 of flash layer 16. The blasting site is located over the contact pads 12 that are to be cleaned of flash layer 16. Positioning nozzle 27 farther away from top surface 28 allows the stream of air exiting the nozzle to spread out into a wider plume 29 before contacting top surface 28. Thus, nozzle 27 must be positioned closer to top surface 28 in order to maintain the stream of air within a smaller blasting site 15.

In step 23, the flow of air that exits nozzle 27 is directed at top surface 28 of flash layer 16 within blasting site 15. The stream of air that exits from nozzle 27 is directed towards top surface 28 at an angle that is between five and thirty degrees away from a normal angle to the top surface. The stream of air is generated by compressing the air to a pressure of more than one hundred pounds per square inch (psi) and then allowing the compressed air to escape from nozzle 27. In order to clean a blasting site 15 that is 5 mm by 5 mm square, the flow of air is generated by compressing the air to a pressure between one hundred and one hundred forty pounds per square inch and then allowing the compressed air to escape from a nozzle that has a diameter of less than two millimeters.

In step 24, blasting particles 30 of a blasting medium are added to the stream of air such that the particles are carried by the stream of air and collide into top surface 28 of flash layer 16 above contact pad 12. The blasting particles 30 are also called micro beads, although they need not be spherically shaped. The blasting medium should have a Mohs hardness of less than three; sodium bicarbonate ($NaHCO_3$), sodium sulfate and ammonium bicarbonate (ammonium hydrogen carbonate, ($NH_4HCO_3$)) can be used. In one embodiment, the blasting particles 30 are monoclinic prisms of sodium bicarbonate that have been purified and sorted through a sieve to have a uniform particle size of about fifty microns in the longest dimension. The blasting particles 30 are stored as a powder and are added into the flow of air by a mixer 31 shortly before exiting nozzle 27.

When cleaning a blasting site 15 that is 5 mm by 5 mm square, the nozzle can be placed about twenty-two millimeters above top surface 28, which allows the blasting particles 30 to achieve their highest velocity. When the particles 30 are first added to the flow of air by mixer 31, the inertia of the particles prevents them from immediately accelerating to the speed of the air flow. However, within about twenty-two millimeters the particles 30 have accelerated to the speed of the stream of air and have achieved their highest velocity. At distances greater than about thirty millimeters from nozzle 27, resistance from ambient air overcomes the thrust from the stream of air and slows down the particles 30. At distances less than about twenty millimeters from nozzle 27, the particles 30 have not yet accelerated to the speed of the flow of air. Thus, where particles of about fifty microns in length are used, flash layer 16 can be removed in the shortest period of time by blasting the particles from a distance of about twenty-two millimeters because the particles possess the most amount of kinetic energy at that distance from the nozzle.

In step 25, the particles 30 are collided into flash layer 16 until the flash layer laterally above contact pad 12 is removed. The particles 30 have facets and edges that rip the silicone of flash layer 16 apart. Then the air blows the ripped pieces of silicone away. Small amounts of sodium bicarbonate remain embedded in the silicone that has not been removed. When cleaning the relatively large blasting sites 15 of FIG. 2, nozzle 27 may be placed at about twenty-two millimeters from top surface 28 of flash layer 16, which permits the particles 30 to acquire their maximum kinetic energy. Consequently, the flash layer in the blasting sites 15 that are squares 5 mm on a side can be removed in a relatively short 2-3 seconds. On the other hand, when cleaning the relatively small blasting site 15 having a diameter of two millimeters located between LED arrays having unit sizes of five millimeters on a side, nozzle 27 must be placed a relatively close two millimeters from top surface 28, which does not permit the particles 30 to achieve their maximum speed. Consequently, the flash layer in a blasting site with a diameter of two millimeters can be removed only after a relatively long eight seconds of blasting.

The stream of air exiting nozzle 27 is not directed in step 23 towards flash layer 16 at an angle normal to top surface 28, i.e., the stream of air is not directed orthogonally to top surface 28. Instead, the stream of air is directed towards flash layer 16 at an angle that is between five and thirty degrees away from normal to the top surface in order to permit the particles 30 to be blown away from the blasting site. If the nozzle were to be directed orthogonally to the top surface of the flash layer, the blasting particles would bounce straight back up and collide with the particles in the stream of air. This would reduce the force by which the blasting particles collide with the flash layer. In addition, the particles would not bounce sideways after striking the top surface and therefore would not be carried out of the blasting site and would build up. On the other hand, if the nozzle were directed at an shallow angle to the top surface of the flash layer, such as an angle greater than thirty degrees from normal, then the vector of the particle speed normal to the top surface would be insufficient to remove the flash layer. The particles would tend to be deflected by the top surface and would not break into the surface.

Even at a steeper angle of incidence, such as ten degrees, the blasting particles 30 are more likely to bounce off of top surface 28 instead of breaking into the surface when flash layer 16 is thicker. At the beginning of the blasting process when flash layer 16 is still about fifty microns thick, the particles 30 are more likely to bounce off top surface 28 because the thicker silicone flash layer can elastically compress to absorb the impact of the particles. As flash layer 16 is eaten away and becomes thinner, the rate of silicone removal becomes faster as the kinetic energy of the particles increasingly tears the silicone as opposed to being absorbed by the silicone.

Current compression molding techniques specify that the thickness of a flash layer of silicone can be 50±25% microns. It is desirable to keep the flash layer as thin as possible to save on silicone but yet allow the silicone to flow freely between the individual lens cavities to achieve high quality lens structures. Where the flash layer is thinner than thirty microns, the elasticity of the silicone layer is reduced to the point that blasting particles do not readily bounce off of the silicone but rather tear the silicone. As even thinner flash layers become possible, the flow of compressed air alone will be sufficient to remove the flash layer from between the lens structures.

Figure 6:
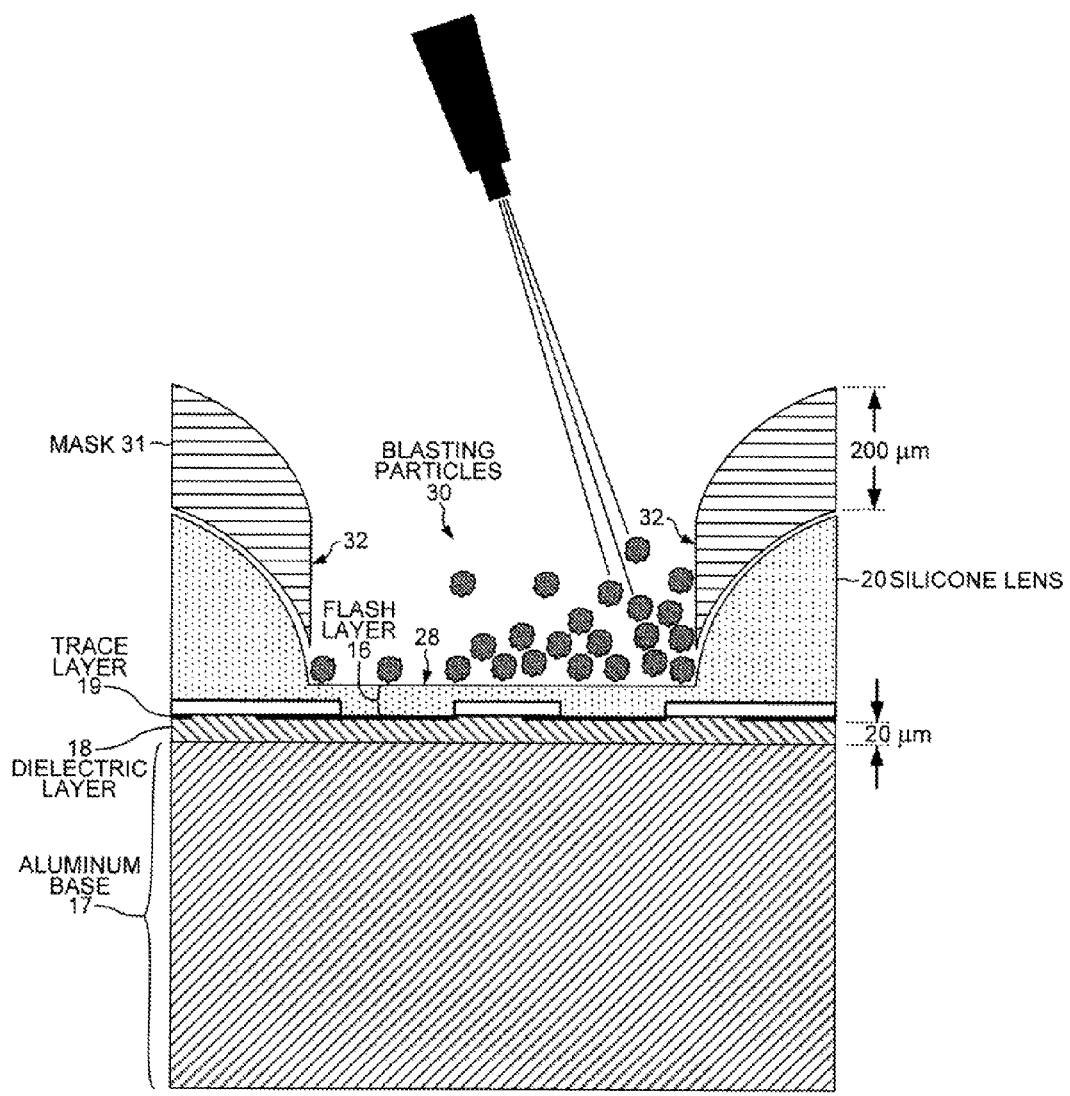
FIG. 6 is a cross sectional view illustrating blasting particles colliding with a flash layer at a blasting site enclosed by a blasting mask.

FIG. 6 illustrates blasting particles at a blasting site that is enclosed by a blasting mask 31. Blasting mask 31 is made of stainless steel and is about 200-500 microns thick. Mask 31 is used when the lenses are particularly close to the blasting sites 15 and must be protected from the blasting particles 30. For example, blasting mask 31 is used for blasting sites located between LED arrays having unit sizes of five millimeters on a side. The blasting process is speeded up by using a mask because the flow of air need not be turned off when moving from site to site. Each lens 20 is protected from the blasting particles 30 by mask 31 as the stream of air moves over the lens to a new blasting site. In contrast, where no blasting mask is used with larger unit sizes, such as an array unit size of 11.5 mm on a side, the flow of air is turned off as the position of the nozzle is moved from one blasting site to another in order to avoid damaging the lens structures.

Using a blasting mask, however, creates other complications that slow down the blasting process. The thickness of the blasting mask creates a well that both (i) obstructs the corners of the blasting site from being reached by the stream of air and (ii) hinders the blasting particles from being blown away from the blasting site. First, the blasting mask obstructs the nearest corner of the blasting site from direct blasting by the angled stream of air. Thus, the far side of the blasting site 15 is cleaned first, and then MCPCB 10 is rotated to permit the cleaning of the other side of the blasting site. The rotation and double pass of the stream of air slow the blasting process. Second, the sides 32 of the blasting mask 31 form a deep well that tends to trap the blasting particles 30. If blasting particles 30 from the stream of air collide with other particles that previously accumulated over the surface of the blasting site 15, then the silicone flash layer 16 will not be torn and ultimately removed. Thus, the angle of the stream of air is increased towards thirty degrees from normal to top surface 28 in order to bounce the particles 30 away from the incoming particles and out of the well. In addition, the pressure of the air used to generate the stream of air is increased towards one hundred forty pounds per square inch in order to provide the particles with enough kinetic energy to bounce out of the well.

Figure 7:
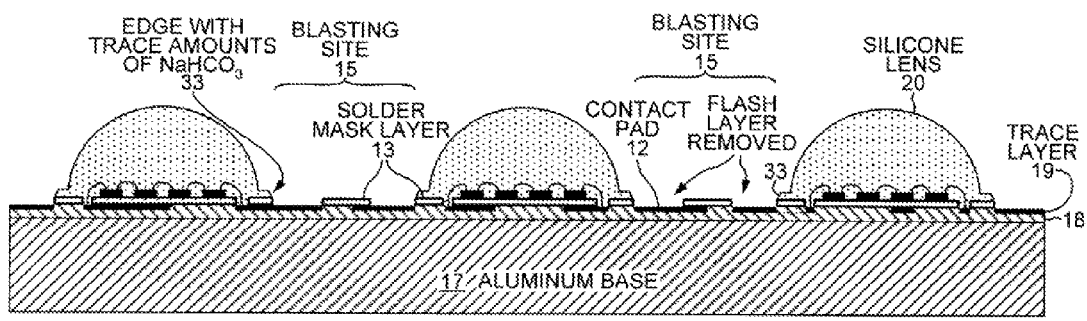
FIG. 7 is a cross sectional view of the blasting sites of FIG. 3 after the flash layer has been removed using the method of FIG. 5.

FIG. 7 is a cross sectional view of the blasting sites 15 of FIG. 3 after the flash layers 16 have been removed using the method of FIG. 5. FIG. 7 shows that after the blasting process, the layer of silicone forms an edge 33 around the contact pads 12 that have been cleaned. Some of the blasting particles 30 break apart in the blasting process and form dust having particles sizes much smaller than 50 microns. Some of the dust lodges in the silicone around the blasting sites 15. Thus, the silicone at edge 33 contains a trace amount of the blasting medium, such as sodium bicarbonate, that remains from the blasting particles 30. The trace amount of sodium bicarbonate can be detected in the segmented LED array light sources using a gas spectrometer.

Figure 8:
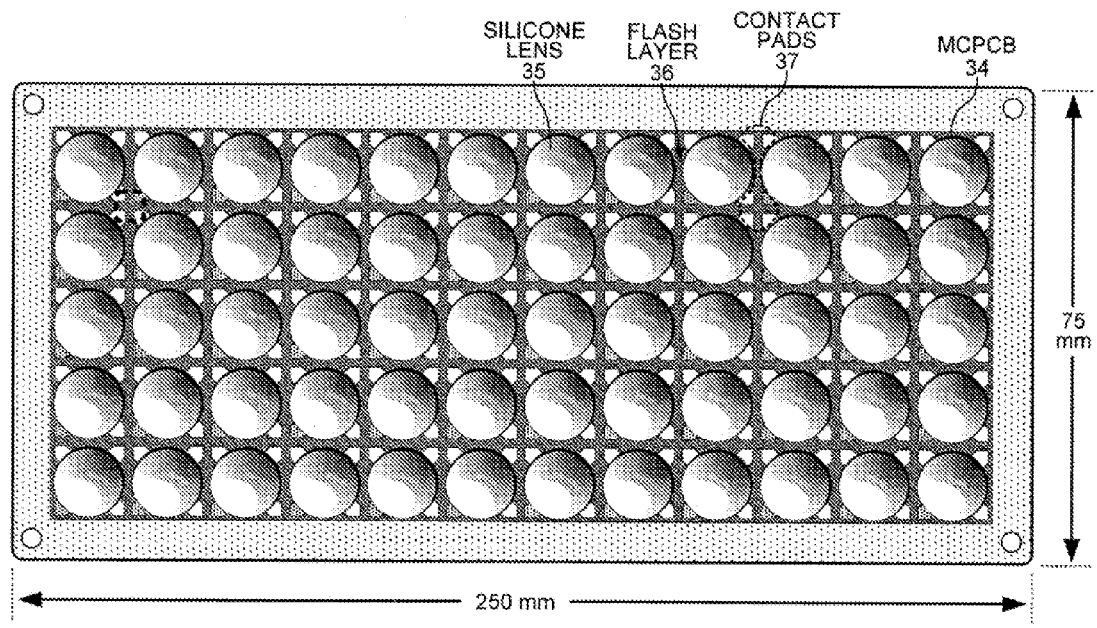
FIG. 8 is a top view of another MCPCB from which a flash layer of silicone is to be removed using the method of FIG. 5.

FIG. 8 is a top view of another MCPCB 34 from which a flash layer of silicone is removed using the method of FIG. 5. In FIG. 8, the lenses 35 and flash layer 36 have already been formed by compression molding. Like MCPCB 10 of FIG. 1, MCPCB 34 also includes a 5×12 matrix of LED arrays. And each LED array is later segmented into a square of the MCPCB that is 11.5 mm on a side. Unlike MCPCB 10 of FIG. 1, however, the contact pads 37 on MCPCB 34 are not formed by exposing areas of a trace layer that is covered by a solder mask layer. Instead, the contact pads 37 are four strips of metal that extend out from under each lens 35. The flash layer 36 covers the metal strips.

Figure 9:
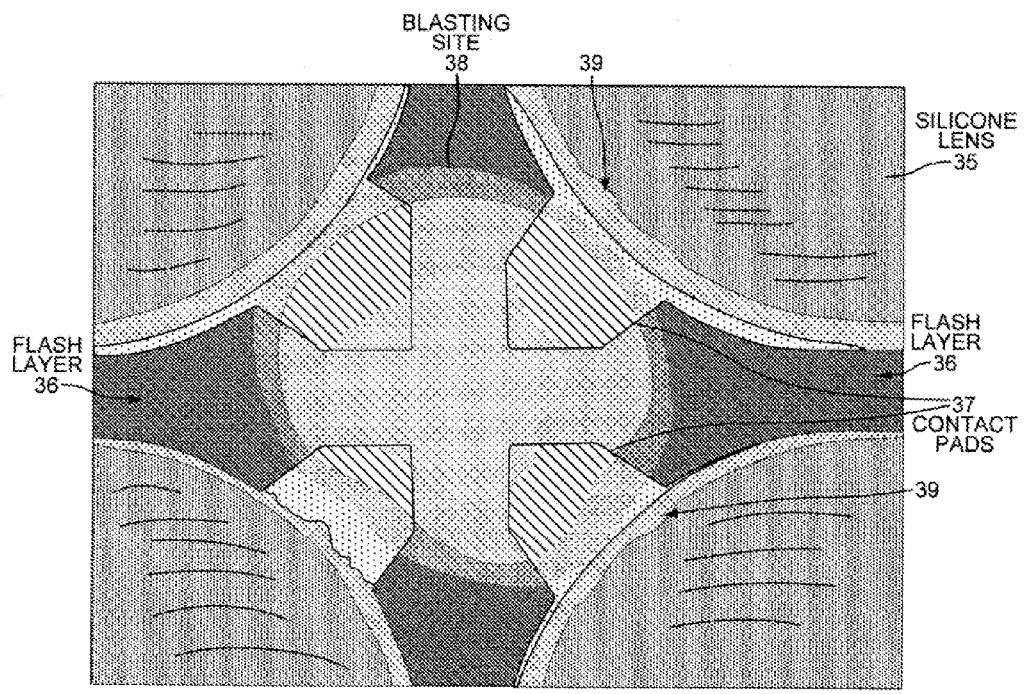
FIG. 9 is a top-down perspective view of a blasting site between four lenses on the MCPCB of FIG. 8.

FIG. 9 is a top-down perspective view of a blasting site 38 between four lenses 35 on MCPCB 34. The micro-bead blasting process was performed using a 0.077 inch diameter nozzle positioned about 22 millimeters above flash layer 36. A pressure of 120 psi was used to generate the stream of air that contained particles of sodium bicarbonate having a median diameter of about 50 microns. The stream of air containing the blasting particles was blasted at blasting site 38 for 1.65 seconds. The blasting removed material to various degrees progressing outwards from the center of blasting site 38. At the center of blasting site 38, the entire thickness of flash layer 36 has been removed, and the blasting has even removed some of the upper layer of gold from the contact pads 37. Some of the dielectric layer was also removed from the center of blasting site 38. Moving outwards from the center of blasting site 38, only the silicone was removed from a large portion of the contacts pads 37 without damaging the upper layers of the contact pads 37. This region is marked with diagonal hashes in FIG. 9. In the next region on each contact pad 37 outwards from the center to the blasting site, the silicone flash layer 36 was not entirely removed from the contact pad. FIG. 9 shows areas 39 on the corners of lenses 35 that have been partially roughened by the blasting process.

Figure 10:
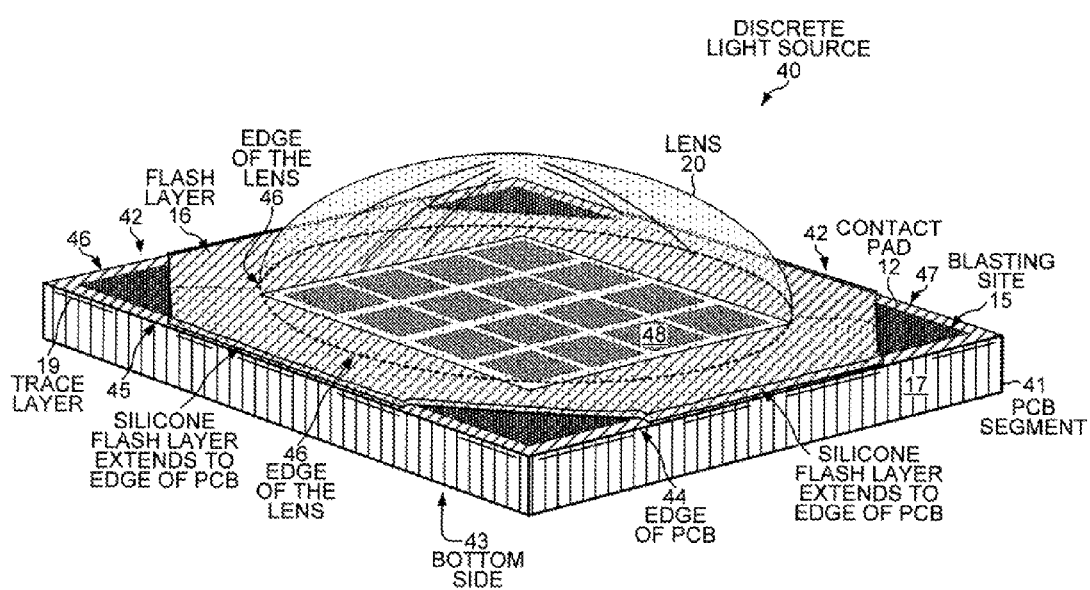
FIG. 10 is a perspective view of a discrete light source with top-side electrical contacts from which a flash silicone layer has been removed.

FIG. 10 is a perspective view of a discrete light source 40 with only top-side electrical contacts from which a flash silicone layer 16 has been removed. Discrete light source 40 was manufactured using the method of FIG. 5. Discrete light source 40 results from the segmentation of the arrays of LED dies 11 mounted on MCPCB 10 of FIG. 1. The printed circuit board (PCB) segment 41 of discrete light source 40 has a top side 42, a bottom side 43, and four edges 44-47. A light emitting diode die 48 is disposed on the top side 42 of PCB segment 41. A contact pad 12 is also disposed on the top side 42 of PCB segment 41. A layer of silicone 16 is disposed over LED die 48 and extends to each of the edges 44-47 of PCB segment 41 except where the silicone flash layer 16 has been removed through blasting. The layer of silicone 16 is not disposed laterally above a portion of contact pad 12 at blasting site 15. In the embodiment of FIG. 10, the silicone flash layer 16 has not been removed from the entire surface of contact pad 12; a small portion of the trace layer that forms contact pad 12 remains covered by silicone.

All of the electrical contacts on discrete light source 40 are on the top side 42. Thus, PCB segment 41 has no electrical contacts on the bottom side 43. The layer of silicone 16 forms lens 20 above LED 48. There are less than three millimeters between the edge 46 of lens 20 and any of the edges 44-47 of PCB segment 41 because discrete light source 40 was segmented from a high density printed circuit board 10. There are also less than three millimeters between the edges 44-47 of PCB segment 41 and any of the LED dies in the array of LED dies. There are no holes that pass from the top side 42 to the bottom side 43 of PCB segment 41. Any punch-outs, through holes or etching cuts in the top side 42 of discrete light source 40 would have hampered the formation of lens 20 using compression molding because the pressurized molding material would have escaped through the holes. The silicone at the edge of blasting site 15 contains a trace amount of the blasting medium that remains embedded in the silicone.

In another embodiment, water-based jetting is used to remove a flash layer of silicone. Purified water is pressurized to a pressure of between fifty and one thousand pounds per square inch and then forced through a nozzle with an opening diameter between one hundred and one thousand microns. The exiting water beam is aimed directly at the flash layer over the electrical contact pads until the flash layer is removed. The combination of the water pressure and nozzle diameter is chosen to achieve a stream of water with enough momentum to break the silicone flash layer but yet that leaves the metal trace layer undamaged. Alternatively to using pure water, abrasive particles such as silica, aluminum oxide or garnet particles can be added to the stream of water to allow a more efficient deflashing process at a lower water pressure compared to with pure water.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. An apparatus comprising:
   a substrate with a top side, a bottom side and side edges;
   a light emitting diode die disposed on the top side of the substrate;
   a contact pad disposed on the top side of the substrate; and
   a layer of silicone disposed over the light emitting diode die, wherein the layer of silicone extends to each of the side edges of the substrate, and wherein the layer of silicone is not disposed laterally above a portion of the contact pad.

2. The apparatus of claim 1, wherein the substrate is solid aluminum.

3. The apparatus of claim 2, wherein a trace layer is disposed on the top side of the substrate.

4. The apparatus of claim 1, wherein the substrate has no electrical contact on the bottom side.

5. The apparatus of claim 1, wherein no holes pass from the top side of the substrate to the bottom side of the substrate.

6. The apparatus of claim 1, wherein the layer of silicone forms a lens above the light emitting diode, and wherein there are less than three millimeters between the edge of the substrate and an edge of the lens.

7. The apparatus of claim 1, wherein a lens is formed from the layer of silicone using compression molding.

8. The apparatus of claim 1, wherein particles of phosphor are contained in the layer of silicone.

9. An apparatus comprising:
a trace layer on a substrate;
a light emitting diode die that is electrically coupled to the trace layer;
a dielectric material disposed over the trace layer, wherein a contact pad is formed on the trace layer by an opening in the dielectric material; and
a layer of silicone disposed over the light emitting diode, wherein the layer of silicone forms an edge around the contact pad, wherein the layer of silicone contains a trace amount of a blasting medium at the edge, and wherein the blasting medium is taken from the group consisting of: sodium bicarbonate, sodium sulfate and ammonium bicarbonate.

10. The apparatus of claim 9, wherein the dielectric layer is epoxy.

11. The apparatus of claim 9, wherein particles of phosphor are contained in the layer of silicone.

12. The apparatus of claim 9, wherein the layer of silicone is not present laterally above the contact pad.

13. The apparatus of claim 9, wherein the layer of silicone forms a lens above the light emitting diode.

14. The apparatus of claim 13, wherein the lens is formed over the substrate using compression molding.

15. The apparatus of claim 13, wherein the substrate has an edge, and wherein there are less than three millimeters between the edge of the substrate and an edge of the lens.

16. An apparatus comprising:
a substrate with a top surface and side edges;
contact pads disposed on the top surface of the substrate;
a light emitting diode (LED) die disposed on the top surface of the substrate, wherein electrical connections to the LED die are made only through the contact pads; and
a compression molded lens formed over the LED die, wherein the compression molded lens is made of a material that extends to each of the side edges of the substrate and that is disposed over substantially all of the top surface of the substrate except for laterally above portions of the contact pads.

17. The apparatus of claim 16, wherein the substrate is a portion of a closed board that has been detached from the closed board.

18. The apparatus of claim 16, further comprising:
solder connections formed on the contact pads; and
leads coupled to the solder connections.

19. The apparatus of claim 16, wherein the material has been selectively removed from areas above the contact pads.

* * * * *